(12) United States Patent
Fang et al.

(10) Patent No.: US 11,915,952 B2
(45) Date of Patent: Feb. 27, 2024

(54) TEMPERATURE CONTROL METHOD, APPARATUS, ELECTRONIC DEVICE AND STORAGE MEDIUM FOR ETCHING WORKBENCH

(71) Applicant: CHANGXIN MEMORY TECHNOLOGIES, INC., Hefei (CN)

(72) Inventors: Yong Fang, Hefei (CN); Chien Chung Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 283 days.

(21) Appl. No.: 17/441,823

(22) PCT Filed: Jun. 7, 2021

(86) PCT No.: PCT/CN2021/098729
§ 371 (c)(1),
(2) Date: Sep. 22, 2021

(87) PCT Pub. No.: WO2022/057325
PCT Pub. Date: Mar. 24, 2022

(65) Prior Publication Data
US 2023/0069582 A1    Mar. 2, 2023

(30) Foreign Application Priority Data
Sep. 16, 2020 (CN) .......................... 202010973759.3

(51) Int. Cl.
*H01L 21/67* (2006.01)
*H01L 21/3213* (2006.01)
*H01L 21/66* (2006.01)

(52) U.S. Cl.
CPC .... *H01L 21/67248* (2013.01); *H01L 21/3213* (2013.01); *H01L 22/12* (2013.01)

(58) Field of Classification Search
None
See application file for complete search history.

(56) References Cited

U.S. PATENT DOCUMENTS

| 10,157,761 | B2 * | 12/2018 | Mimura | ............ G05D 23/1934 |
| 2001/0055102 | A1 * | 12/2001 | Emoto | ................ G03F 7/70891 |
| | | | | 355/53 |

(Continued)

FOREIGN PATENT DOCUMENTS

| CN | 103087909 A | 5/2013 |
| CN | 103677015 A | 3/2014 |

(Continued)

OTHER PUBLICATIONS

International Search Report cited in PCT/CN2021/098729 dated Sep. 15, 2021, 9 pages.

*Primary Examiner* — Shamim Ahmed
(74) *Attorney, Agent, or Firm* — Cooper Legal Group, LLC

(57) ABSTRACT

The present application provides a temperature control method, an apparatus, an electronic device and a storage medium for an etching workbench. A real-time temperature of an etching workbench and a real-time temperature of a temperature control fluid are acquired firstly; then, a temperature control instruction is determined according to the real-time temperature of the etching workbench, the real-time temperature of the temperature control fluid and a limit temperature; and finally, in response to the temperature control instruction, a target operating temperature of the etching workbench is stabilized within a preset range by a circulating temperature control fluid loop.

16 Claims, 7 Drawing Sheets

(56) References Cited

U.S. PATENT DOCUMENTS

2006/0213433 A1* 9/2006 Kado ................. B05C 11/1042
                                                                    118/52
2006/0292845 A1* 12/2006 Chiang ............. H01L 21/67207
                                                                    257/E21.295

FOREIGN PATENT DOCUMENTS

| CN | 206921978 U | 1/2018 |
| CN | 107972514 A | 5/2018 |
| CN | 110094313 A | 8/2019 |
| CN | 209210969 U | 8/2019 |
| JP | 2004111819 A | 4/2004 |

* cited by examiner

TEMPERATURE CONTROL METHOD, APPARATUS, ELECTRONIC DEVICE AND STORAGE MEDIUM FOR ETCHING WORKBENCH

CROSS-REFERENCE TO RELATED APPLICATIONS

The present application is a national stage entry of International Application No. PCT/CN2021/098729, filed on Jun. 7, 2021, which claims the priority to Chinese Patent Application 202010973759.3, titled "TEMPERATURE CONTROL METHOD, APPARATUS, ELECTRONIC DEVICE AND STORAGE MEDIUM FOR ETCHING WORKBENCH", filed to the CNIPA on Sep. 16, 2020. The entire contents of International Application No. PCT/CN2021/098729 and Chinese Patent Application 202010973759.3 are incorporated herein by reference.

TECHNICAL FIELD

The present application relates to the technical field of semiconductors, and in particular to a temperature control method, an apparatus, an electronic device and a storage medium for an etching workbench.

BACKGROUND

The etching technology is an important process in the processing of semiconductor components and integrated circuits, and also applied to the processing of thin film circuits, printed circuits and other fine patterns. Etching is to selectively remove a part of the thin film layer that is not masked by the resist by chemical methods or physical methods or chemical and physical methods, so as to obtain, on the thin film, a pattern that is completely consistent with the pattern on the resist film.

At present, the etching technology is mainly classified into dry etching and wet etching. The dry etching mainly uses a reactant gas and plasma for etching, while the wet etching mainly uses a chemical reagent to chemically react with the etched material for etching. The temperature in the etching process has a great influence on the etching quality. Since uneven heat and cold is very easy to result in the deformation of the etching substrate, the etching quality is reduced.

For the existing etching workbenches, the temperature of the etching workbench in the etching process is generally regulated by controlling the temperature of the cooling fluid at the input terminal of the etching workbench. However, since the cooling fluid continuously absorbs heat when flowing in the pipe, there is a difference in temperature between the cooling fluid at the input terminal and the cooling fluid at the output terminal of the etching workbench, thereby resulting in an uneven temperature distribution of the etching substrate, leading to substrate deformation and affecting the etching quality.

SUMMARY

In a first aspect, the present application provides a temperature control method for an etching workbench, comprising following steps:
   acquiring a real-time temperature of the etching workbench and a real-time temperature of a temperature control fluid, the real-time temperature of the etching workbench is a current operating temperature of the etching workbench, the real-time temperature of the temperature control fluid is a current operating temperature of the temperature control fluid in a circulating temperature control fluid loop;
   determining a temperature control instruction according to the real-time temperature of the etching workbench, the real-time temperature of the temperature control fluid and a limit temperature; and
   stabilizing, by the circulating temperature control fluid loop responding to the temperature control instruction, a target operating temperature of the etching workbench within a preset range.

In a second aspect, the present application provides a temperature control system for an etching workbench, comprising:
   a workbench temperature control fluid loop, a temperature adjustment loop, an evaporator and a controller, wherein both the workbench temperature control fluid loop and the temperature adjustment loop pass through the evaporator, the workbench temperature control fluid loop is not connected with the temperature adjustment loop, and the controller is electrically connected to the workbench temperature control fluid loop and the temperature adjustment loop;
   the workbench temperature control fluid loop is configured to adjust the temperature of the etching workbench; and
   the controller is configured to control the temperature adjustment loop to adjust a real-time temperature of a temperature control fluid in the workbench temperature control fluid loop by the evaporator, so that a target operating temperature of the etching workbench is stabilized within a preset range.

In a third aspect, the present application provides a temperature control apparatus for an etching workbench, comprising:
   an acquisition module, configured to acquire a real-time temperature of the etching workbench and a real-time temperature of a temperature control fluid, the real-time temperature of the etching workbench is a current operating temperature of the etching workbench, the real-time temperature of the temperature control fluid is a current operating temperature of the temperature control fluid in a circulating temperature control fluid loop; and
   a processing module, configured to determine a temperature control instruction according to the real-time temperature of the etching workbench, the real-time temperature of the temperature control fluid and a limit temperature, and stabilize, by the circulating temperature control fluid loop responding to the temperature control instruction, a target operating temperature of the etching workbench within a preset range.

In a fourth aspect, the present application provides an electronic device, comprising:
   a memory, configured to store program codes; and
   a processor, configured to call and execute the program codes stored in the memory so as to execute any possible one of the temperature control methods for an etching workbench provided in the first aspect.

In a fifth aspect, the present application provides a computer-readable storage medium having computer programs stored therein that are configured to execute any possible one of the temperature control methods for an etching workbench provided in the first aspect.

In a sixth aspect, a computer program is provided, comprising program codes that execute any possible one of the temperature control methods for an etching workbench provided in the first aspect when a computer runs the computer program.

In a seventh aspect, a computer program product is provided, comprising computer programs that, when executed by a processor, implement any possible one of the temperature control methods for an etching workbench provided in the first aspect.

DETAILED DESCRIPTION

To make the objectives, technical solutions and advantages of the embodiments of the present application clearer, the technical solutions in the embodiments of the present application will be described clearly and completely with reference to the drawings in the embodiments of the present application. Apparently, the embodiments to be described are only some but not all of the embodiments of the present application. Based on the embodiments of the present application, all other embodiments, including but not limited to combinations of multiple embodiments, obtained by a person of ordinary skill in the art without paying any creative effort shall fall into the protection scope of the present application.

The terms "first", "second", "third", "fourth" or the like (if any) used in the specification, claims and drawings of the present application are used for distinguishing similar objects, rather than describing a particular order or sequence. It should be understood that the data used in such a way may be interchanged if appropriate, so that the embodiments of the present application described herein can be implemented in an order other than those illustrated or described herein. In addition, the terms "comprise/comprising" and "having" and any variants thereof are intended to encompass nonexclusive inclusion. For example, a process, method, system, product or device comprising a series of steps or units is not limited to the steps or units that are listed explicitly, and may comprise other steps or units that are not listed explicitly or inherent to the process, method, product or device.

The etching technology is an important process in the processing of semiconductor components and integrated circuits, and also applied to the processing of thin film circuits, printed circuits and other fine patterns. Etching is to selectively remove a part of the thin film layer that is not masked by the resist by chemical methods or physical methods or chemical and physical methods, so as to obtain, on the thin film, a pattern that is completely consistent with the pattern on the resist film.

The temperature in the etching process has a great influence on the etching quality. Since uneven heat and cold is very easy to result in the deformation of the etching substrate, the etching quality is reduced.

Figure 1:
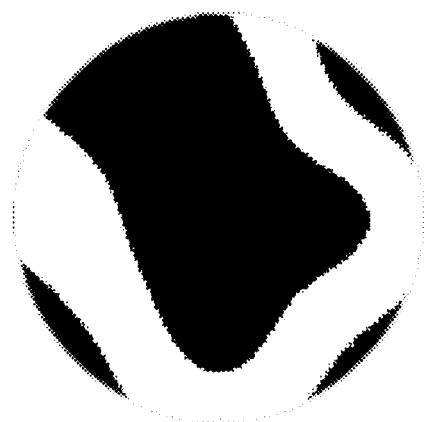
FIG. 1 is a schematic diagram of a temperature distribution of an etching workbench in the prior art according to the present application.

FIG. 1 is a schematic diagram of a temperature distribution of an etching workbench in the prior art according to the present application. As shown in FIG. 1, in the process of etching an integrated circuit, a temperature distribution at a certain moment is acquired by an etching workbench monitoring system. It can be known that the temperature distribution is asymmetrical at this time, and the asymmetrical distribution will lead to uncontrollable and unpredictable deformation of the substrate, thereby affecting an irregular distribution of etching indexes such as etching depth.

It can be known that uneven or irregular temperature distribution is an important factor that affects the etching quality. The inventor(s) of the present application has (have) deeply analyzed how to solve the problem of uneven or irregular temperature distribution in the prior art.

Figure 2:
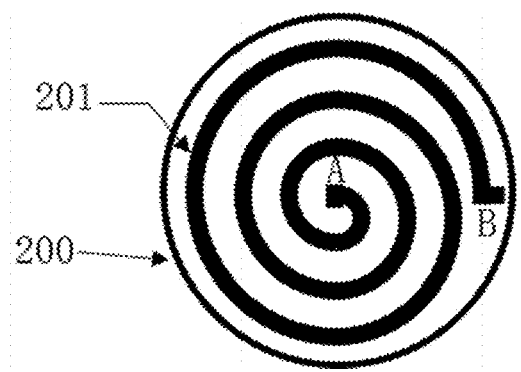
FIG. 2 is a schematic diagram of a temperature control fluid flow pipe of an etching workbench in the prior art according to the present application.

FIG. 2 is a schematic diagram of a temperature control fluid flow pipe of an etching workbench in the prior art according to the present application. As shown in FIG. 2, for the existing temperature control systems for etching workbenches, the temperature of the etching workbench 200 in the etching process is generally regulated by controlling the temperature of the temperature control fluid at the input terminal A of the etching workbench 200. However, since the temperature control fluid continuously absorbs heat when flowing in the pipe 201, there is a large difference in temperature between the temperature control fluid at the input terminal A and the temperature control fluid at the output terminal B of the etching workbench 200, thereby resulting in an uneven temperature distribution of the etching substrate, leading to substrate deformation and affecting the etching quality.

The most direct solution to this problem is to replace with a temperature control fluid with a higher specific heat capacity and a better fluidity. In the case of a higher specific heat capacity, more heat can be absorbed without increasing the temperature too much; and in the case of a better fluidity, the temperature control fluid can quickly flow out from the etching workbench and thus take away heat quickly. However, the improvements to the physical and chemical properties of the existing temperature control fluid cannot satisfy the requirements for temperature control in the etching process, or the cost to use and maintain the temperature control fluid is too high.

Another common solution is to lower the temperature control threshold of the temperature control fluid. Since the temperature of the etching workbench is controlled by the temperature of the temperature control fluid at the input terminal A of the pipe 201 in the prior art, theoretically, the problem that heat cannot be sent out from the etching workbench in time can be solved by limiting the temperature to a lower level. However, in an actual test, it is found that the circulating temperature control fluid needs to pass through an air cooling pipe or other heat dissipation/heating devices after flowing out from the output terminal B so that the temperature at the input terminal A reaches a preset temperature value. That is, the temperature control fluid has a long route from the output terminal B to the input terminal A through the circulation loop. Thus, the change in temperature of the etching workbench cannot be found in time by monitoring the temperature at the input terminal A, and it can be monitored by the temperature control system only when the heat of the etching workbench has much deviated from an allowable range. Therefore, even if the temperature control threshold is lowered, the problem that the substrate is irregularly deformed since a sudden change in temperature of the etching workbench cannot be found in time is not solved.

It can be known that the technical difficulty in solving the technical problem of uneven or irregular temperature distribution of the etching workbench is how to eliminate or shorten the time delay for finding the change in temperature of the etching workbench. Since the temperature distribution of the exiting etching workbench is manually detected by a tester in need of other testing instruments, the tester needs to obtain a large amount of test data for each etched product to establish an adjustment strategy for the temperature control system. As a result, it is time-consuming and costly, and it is obviously unpractical to repeat a large number of tests every time a new etched product is updated.

Furthermore, since the controlled object of the temperature control system is conventionally considered as the temperature control fluid in the prior art, the feedback signal of control only adjusts the temperature of the temperature control fluid. In this way, the temperature of the temperature control fluid is stabilized at a temperature-control fluid temperature sensor. However, for the etching workbench, this is an indirect temperature control target, and the accurate control of the temperature of the etching workbench cannot be realized.

Therefore, in view of the technical problem in the prior art that an uneven or irregular temperature distribution of the etching workbench is caused by adjusting the temperature of the etching workbench by the temperature feedback of the temperature control fluid so that the uncontrollable deformation of the etching substrate is caused, the etching quality is affected and the cost and difficulty of subsequent product testing is increased, the present application provides a temperature control method for an etching workbench. The detailed description will be given below by specific embodiments with reference to the drawings.

Figure 3:
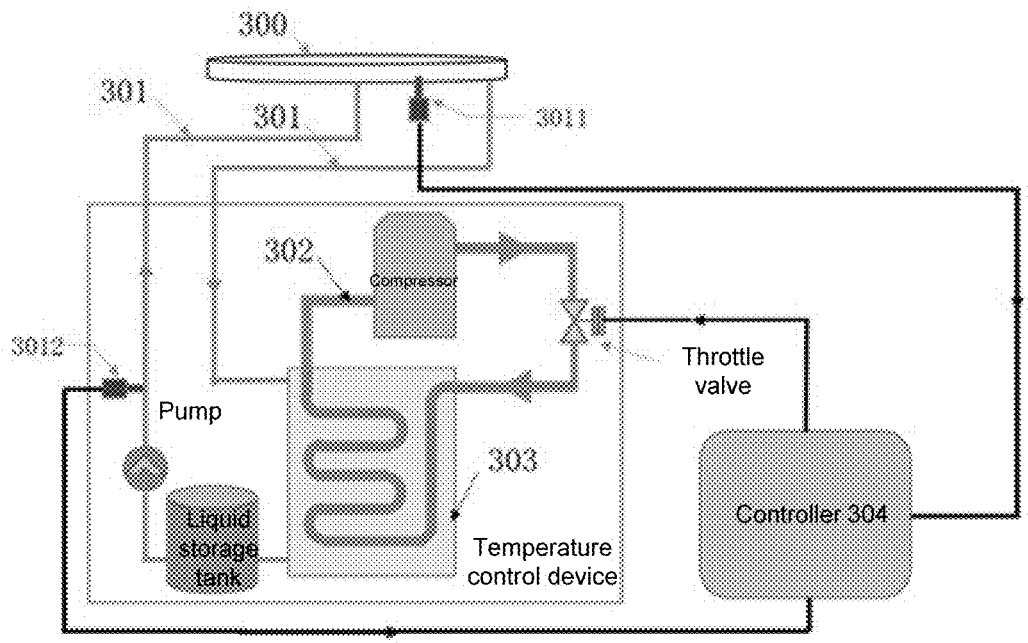
FIG. 3 is a schematic structure diagram of a temperature control system for an etching workbench according to an embodiment of the present application.

FIG. 3 is a schematic structure diagram of a temperature control system for an etching workbench according to an embodiment of the present application. As shown in FIG. 3, the temperature control system for an etching workbench comprises: a workbench temperature control fluid loop 301, a temperature adjustment loop 302, an evaporator 303 and a controller 304. Both the workbench temperature control fluid loop 301 and the temperature adjustment loop 302 pass through the evaporator 303, the workbench temperature control fluid loop 301 is not connected with the temperature adjustment loop 302, and the controller 304 is electrically connected to the workbench temperature control fluid loop 301 and the temperature adjustment loop 302.

Specifically, the workbench temperature control fluid loop 301 comprises: a workbench temperature sensor 3011 (i.e., a second sensor) mounted on the etching workbench 300, a temperature-control fluid temperature sensor 3012 (i.e., a first sensor) included in the workbench temperature control fluid loop 301, a temperature control pipe section distributed in the etching workbench 300 and a delivery pipe section arranged outside the etching workbench 300. The workbench temperature sensor 3011 is configured to detect the real-time temperature of the etching workbench in real time, and the temperature-control fluid temperature sensor 3012 is configured to detect the real-time temperature of a temperature control fluid at an outlet of a temperature control fluid pump in the delivery pipe section outside the etching workbench 300 in real time. The temperature signals from the temperature sensors are transmitted to the controller 304 as temperature feedback signals.

The workbench temperature control fluid loop 301 is configured to adjust the temperature of the etching workbench 300.

The controller 304 is configured to control the temperature adjustment loop 302 to adjust the real-time temperature of the temperature control fluid in the workbench temperature control fluid loop 301 by the evaporator 303, so that a target operating temperature of the etching workbench 300 is stabilized within a preset range.

The temperature adjustment loop 302 comprises a throttle valve, a compressor and an evaporator pipe section. An input terminal of the compressor is connected to an output terminal of the evaporator pipe section, while an output terminal thereof is connected to an input terminal of the throttle valve. An output terminal of the throttle valve is connected to an input terminal of the evaporator pipe section. The throttle valve is electrically connected to the controller.

The compressor is configured to drive a temperature control medium (liquid or gas) in the temperature adjustment loop 302 to flow.

The throttle valve is configured to receive a temperature control instruction from the controller 304 to control the flow of the temperature control medium.

The temperature control medium flowing through the evaporator pipe section transfers heat with the temperature control fluid in the workbench temperature control fluid loop 301 by the evaporator 303, so that the target operating temperature of the etching workbench 300 is stabilized within the preset range.

It is to be noted that there may be more than one workbench temperature sensor 3011. In one possible implementation, a plurality of workbench temperature sensors 3011 are distributed on the etching workbench 300 at uniform intervals, for example, being distributed in an annular arrangement or a matrix arrangement. In this case, the real-time temperature of the etching workbench 300 is detected by the plurality of workbench temperature sensors 3011. It should be understood that the plurality of workbench temperature sensors 3011 may also be distributed at non-uniform intervals and arranged according to actual temperature detection requirements. The mounting and distribution mode of the workbench temperature sensor 3011 is not limited in the present application, and its implementation may be specifically selected by those skilled in the art according to the actual situation. Similarly, there may also be a plurality of temperature-control fluid temperature sensors 3012, which may be distributed at a plurality of positions in the workbench temperature control fluid loop 301. In this case, the real-time temperature of the temperature control fluid is the average temperature of the temperatures measured by the plurality of temperature-control fluid temperature sensors 3012.

Figure 4:
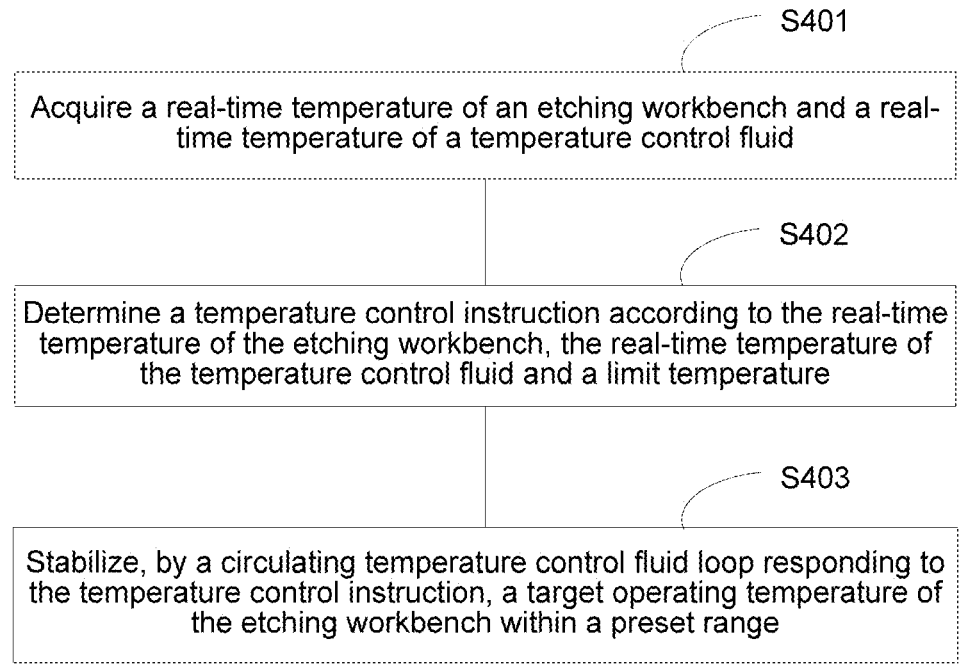
FIG. 4 is a flowchart of a temperature control method for an etching workbench according to an embodiment of the present application.

The operation flow of the temperature control system for an etching workbench in FIG. 3 is shown in FIG. 4.

FIG. 4 is a flowchart of a temperature control method for an etching workbench according to an embodiment of the present application. As shown in FIG. 4, the temperature control method for an etching workbench comprises the following specific steps.

S401: A real-time temperature of the etching workbench and a real-time temperature of a temperature control fluid are acquired.

In this step, the real-time temperature of the etching workbench is the current operating temperature of the etching workbench 300, and the real-time temperature of the temperature control fluid is the current operating temperature of the temperature control fluid in a circulating temperature control fluid loop.

The real-time temperature of the etching workbench and the real-time temperature of the temperature control fluid are monitored in real time by temperature sensors.

S402: A temperature control instruction is determined according to the real-time temperature of the etching workbench, the real-time temperature of the temperature control fluid and a limit temperature.

In this step, the real-time temperature of the etching workbench is used as a main feedback signal, the real-time temperature of the temperature control fluid is used as an auxiliary feedback signal, and the limit temperature is an upper temperature limit or a certain temperature control range (e.g., [35° C.,38° C.]) which is allowed for the etching workbench 300 within a certain period of time according to the etching process steps.

Specifically, the controller 304 may adopt a dual closed-loop feedback mode. The real-time temperature of the etching workbench and the limit temperature form a main closed-loop feedback control, and the real-time temperature of the temperature control fluid and the limit temperature form an auxiliary closed-loop feedback control. By combining the both, a temperature control instruction for comprehensively controlling the temperature of the etching workbench and the temperature of the temperature control fluid is generated.

It is to be noted that, unlike the control strategy using the temperature of the temperature control fluid as main feedback in the prior art, in the embodiment of the present application, the real-time temperature of the etching workbench is a main controlled object, that is, it is more inclined to use the temperature of the etching workbench as the controlled object in the control strategy. In this way, when the temperature of the etching workbench is changed, temperature adjustment can be controlled in time, thereby greatly increasing the response speed of the temperature control system for an etching workbench, quickly giving out a corresponding adjustment instruction for the change in temperature of the etching workbench, reducing the temperature fluctuation range of the etching workbench and improving the etching quality of etched products.

In one possible design, the real-time temperature of the etching workbench, the real-time temperature of the temperature control fluid and the limit temperature may also be processed by a neural network model to establish a self-learning or self-adaptive temperature control strategy. In this way, the independent establishment of a control model or control strategy for each etched product can be avoided, the workload of developers can be alleviated, and the temperature control cost can be reduced.

S403: In response to the temperature control instruction, the circulating temperature control fluid loop stabilizes a target operating temperature of the etching workbench within a preset range.

In this step, the circulating temperature control fluid loop comprises a workbench temperature control fluid loop 301 and a temperature adjustment loop 302. Upon determining the temperature control instruction, the controller 304 sends the temperature control instruction to the throttle valve in the temperature adjustment loop 302. The temperature control instruction is used to control the opening of the throttle valve so as to control the flow of a temperature control medium (liquid or gas) in the temperature adjustment loop 302.

After the compressor pressurizes the temperature control medium (liquid or gas), the flow or flow rate can be adjusted by the throttle valve. When the temperature control medium in the temperature adjustment loop 302 is controlled to flow through the evaporator 303, that is, when the liquid or gas flows in the evaporator pipe section, the heat in the temperature control fluid in the pipe section of the workbench temperature control fluid loop 301 located in the evaporator is absorbed or taken away, so that the real-time temperature of the temperature control fluid in the workbench temperature control fluid loop 301 is reduced.

In short, heat is produced in the etching process and transferred to the etching workbench through the etching substrate. The temperature control fluid in the workbench temperature control fluid loop 301 absorbs the heat in the etching workbench 300 when flowing in the pipe section in the etching workbench. As the temperature control fluid flows into the evaporator, the heat is taken away by the evaporator; and then, a part of the heat is dissipated in the air, while a part of the heat is absorbed and taken away by the temperature control medium in the temperature adjustment loop 302, thereby realizing the transfer of the etching heat. In the temperature control method according to the embodiment of the present application, the heat can be found in time when it is transferred to the workbench, and the heat is transferred out from the workbench as soon as possible by controlling the opening of the throttle valve and quickening the speed of heat transfer, thereby avoiding the temperature rise of the substrate due to heat accumulation and the deformation caused by heat expansion and cold contraction.

This embodiment of the present application provides a temperature control method for an etching workbench. A real-time temperature of an etching workbench and a real-time temperature of a temperature control fluid are acquired firstly; then, a temperature control instruction is determined according to the real-time temperature of the etching workbench, the real-time temperature of the temperature control fluid and a limit temperature; and finally, in response to the temperature control instruction, a target operating temperature of the etching workbench is stabilized within a preset range by a circulating temperature control fluid loop. By adding the feedback quantity of the real-time temperature of the etching workbench, the response speed of temperature control is increased, and the overshoot of temperature is reduced, so that the temperature distribution of a substrate during etching is regularized, the technical problem of poor etching quality caused by substrate deformation due to an uneven temperature distribution of an etching workbench in the prior art is solved, and the technical effects of realizing controllable substrate deformation rules, making the etching effect satisfy the expected design and improving the etching quality are achieved.

Figure 5:
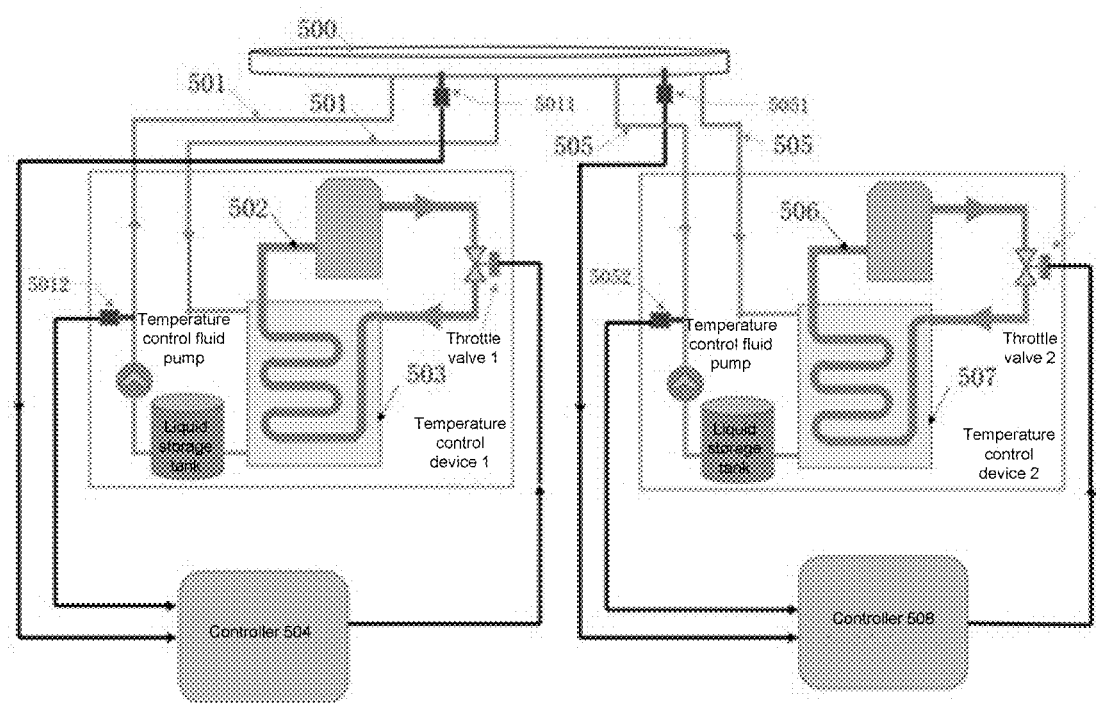
FIG. 5 is a schematic structure diagram of another temperature control system for an etching workbench according to an embodiment of the present application.

FIG. 5 is a schematic structure diagram of another temperature control system for an etching workbench according to an embodiment of the present application. As shown in FIG. 5, the temperature control system for an etching workbench comprises: a center loop 501, a center region temperature adjustment loop 502, a center region evaporator 503, a controller 504, an edge loop 505, an edge region temperature adjustment loop 506, an edge region evaporator 507 and a controller 508. A first temperature control pipe section of the center loop 501 in a center region of the etching workbench 500 is not connected with a second temperature control pipe section of the edge loop 505 in an edge region of the etching workbench 500. A first workbench temperature sensor 5011 and a second workbench temperature sensor 5051 are mounted on the etching workbench 500. The center loop 501 includes a first temperature-control fluid temperature sensor 5012, and the edge loop 505 includes a second temperature-control fluid temperature sensor 5052.

As shown in FIG. 5, the center loop 501 and the edge loop 505 are located in a temperature control device 1 and a temperature control device 2 respectively. The two temperature control devices cooperate to realize the temperature control of the etching workbench 500 under the control of the controller 504 and the controller 508.

It is to be noted that, in the center loop 501 or the edge loop 505, the temperature control fluid is stored in a liquid storage tank, a temperature control fluid pump pumps the temperature control fluid out from the liquid storage tank, and the first temperature-control fluid temperature sensor 5012 and the second temperature-control fluid temperature sensor 5052 monitor the real-time temperature of the temperature control fluid at the output terminal of the temperature control fluid pump in real time. Of course, it should be understood that the first temperature-control fluid temperature sensor 5012 and/or the second temperature-control fluid temperature sensor 5052 may also be configured as a plurality of temperature sensors distributed at various positions of the pipe, and the average temperature of the plurality of temperature sensors is used as the real-time temperature of the temperature control fluid.

It is also to be noted that, after the compressors in the center region temperature adjustment loop 502 and the edge region temperature adjustment loop 506 pressurize a temperature control medium (liquid or gas), the flow rate or flow is controlled by a throttle valve 1 and a throttle valve 2, so that the temperature control medium takes away heat in the temperature control fluid in the center loop 501 and the edge loop 505 through the center region evaporator 503 and the edge region evaporator 507.

In one possible design, the controller 504 and the controller 508 are a same controller.

In the prior art, since the pipe route of the temperature control fluid in the etching workbench is too long, the temperature control fluid has a large difference in temperature between the input and output terminals of the etching workbench, and heat is continuously absorbed from the etching workbench as the temperature control fluid flows. In order to make heat leave the etching workbench as soon as possible, in the embodiment of the present application, the pipe in the etching workbench is divided into two independent regions that are not connected with each other, i.e., a first temperature control pipe section and a second temperature control pipe section. That is, the temperature control pipe section of the etching workbench comprises a first temperature control pipe section and a second temperature control pipe section. The first temperature control pipe section is located in the center region of the etching workbench, the second temperature control pipe section is located in the edge region of the etching workbench, and the first temperature control pipe section and the second temperature control pipe section are not connected in the etching workbench. The detailed description will be given below with reference to FIG. 6.

Figure 6:
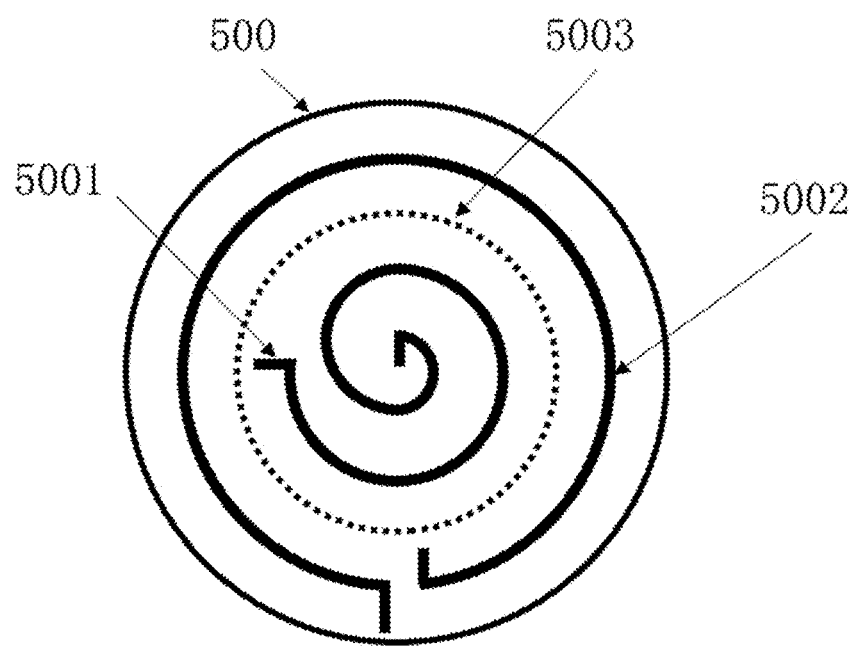
FIG. 6 is a schematic structure diagram of another temperature control pipe layout of an etching workbench according to an embodiment of the present application.

FIG. 6 is a schematic structure diagram of another temperature control pipe layout of an etching workbench according to an embodiment of the present application. As shown in FIG. 6, a first temperature control pipe section 5001 is arranged in the center region of the etching workbench 500. The so-called temperature control pipe section is a passage through which the temperature control fluid flows. A second temperature control pipe section 5002 is arranged in the edge region of the etching workbench 500, and the second temperature control pipe section 5002 is not connected with the first temperature control pipe section 5001. That is, the temperature control fluid flows independently in the two pipe sections. In this way, the flowing route of the temperature control fluid in the etching workbench can be shortened, and the heat in the etching workbench can be taken away as soon as possible, so that the temperature of the etching workbench is stabilized within a preset range and the problem of uneven or irregular temperature distribution can be effectively solved.

In one possible design, there is a temperature isolation zone 5003 between the first temperature control pipe section 5001 and the second temperature control pipe section 5002, and the temperature isolation zone 5003 is configured to isolate heat transfer between the first temperature control pipe section 5001 and the second temperature control pipe section 5002. The temperature isolation zone 5003 may be formed as a hollow groove in which a heat insulation material is filled, thus avoiding the disadvantageous situation that heat is transferred between the first temperature control pipe section 5001 and the second temperature control pipe section 5002 but not transported to the outside of the etching workbench as soon as possible.

The specific steps of the temperature control method for the temperature control system for an etching workbench in this embodiment will be described below in detail with reference to FIG. 7.

Figure 7:
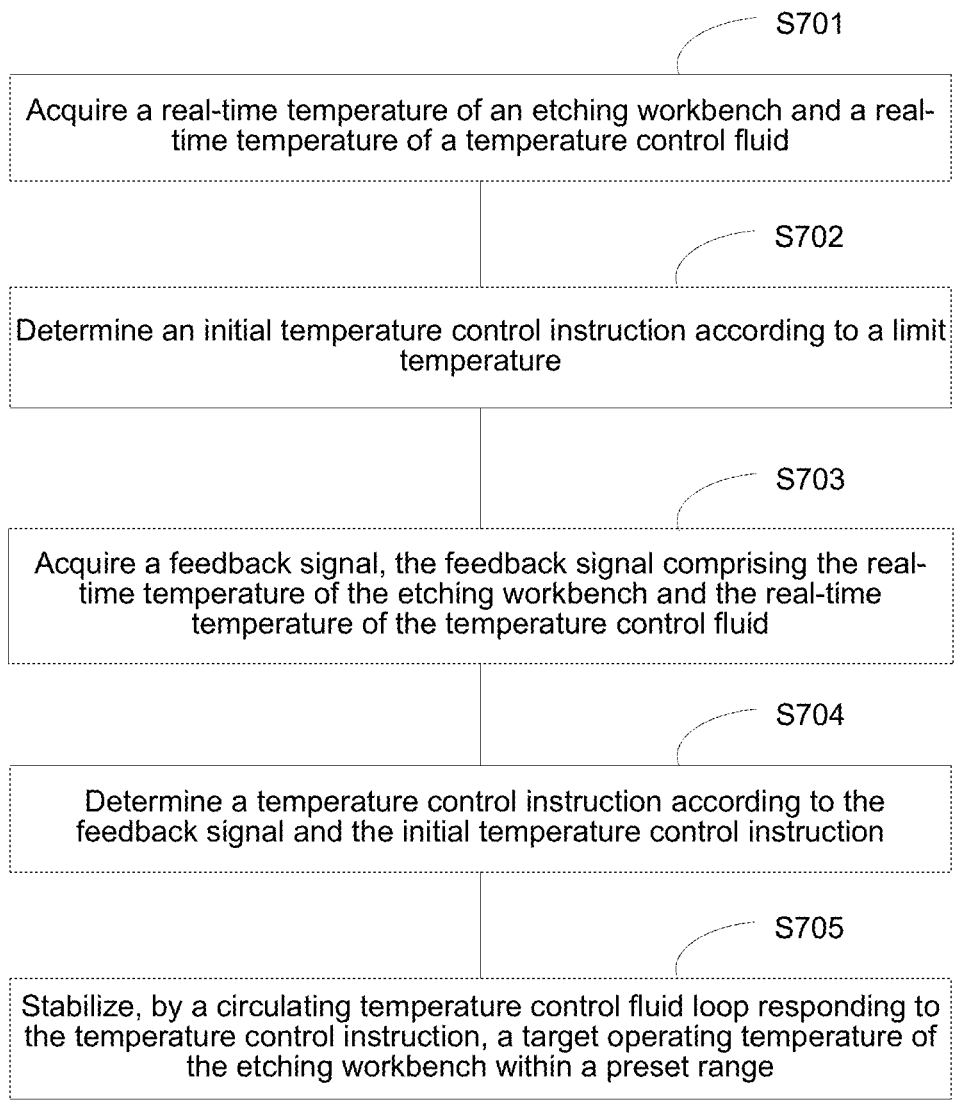
FIG. 7 is a flowchart of another temperature control method for an etching workbench according to an embodiment of the present application.

FIG. 7 is a flowchart of another temperature control method for an etching workbench according to an embodiment of the present application. As shown in FIG. 7, the temperature control method for an etching workbench comprises the following specific steps.

S701: A real-time temperature of the etching workbench and a real-time temperature of a temperature control fluid are acquired.

In this step, the real-time temperature of the etching workbench is the current operating temperature of the etching workbench, and the real-time temperature of the temperature control fluid is the current operating temperature of the temperature control fluid in a circulating temperature control fluid loop.

As shown in FIGS. 5 and 6, the real-time temperature of the etching workbench and the real-time temperature of the temperature control fluid are monitored in real time by temperature sensors, comprising:

At a certain moment, a first workbench temperature sensor 5011 and a second workbench temperature sensor 5051 acquire current operating temperatures of a center region and an edge region of the etching workbench 500 respectively, and the temperatures of the temperature control fluid in a center loop 501 and an edge loop 505 monitored by a first temperature-control fluid temperature sensor 5012 and a second temperature-control fluid temperature sensor 5052 are also acquired.

S702: An initial temperature control instruction is determined according to a limit temperature.

In this step, the limit temperature comprises a center limit temperature and an edge limit temperature, and this step specifically comprises:
- determining an initial central temperature control instruction according to the center limit temperature; and
- determining an initial edge temperature control instruction according to the edge limit temperature;
- wherein the temperature control instruction comprises the center temperature control instruction and the edge temperature control instruction.

It is to be noted that, depending upon different etched products or different etching process requirements, the center region and the edge region of the etching workbench 500 may be inconsistent in temperature. At this time, the initial center temperature control instruction and the initial edge temperature control instruction are to preheat the workbench according to the preset optimal etching process temperature.

It should be understood that, if the center region and the edge region are required to be consistent in temperature, the center limit temperature is the same as the edge limit temperature, and the initial center temperature control instruction and the initial edge temperature control instruction are the same temperature control instruction.

It is also to be noted that, for the physical properties of the temperature control fluid, the heat conductivity is the highest when it is maintained within a certain temperature range, so there is a heating module or device in the compressor so that the temperature control medium in the temperature adjustment loop preheats the temperature control fluid in the center loop and the edge loop by the evaporator. Thus, the temperature control fluid can operate at the optimal heat absorption temperature, that is, the temperature control fluid enters the target operating temperature.

S703: A feedback signal is acquired, the feedback signal comprising the real-time temperature of the etching workbench and the real-time temperature of the temperature control fluid.

In this step, the real-time temperature of the etching workbench 500 comprises a center region temperature and an edge region temperature, and this step specifically comprises:
- acquiring a first feedback signal, the first feedback signal comprising the center region temperature and the first temperature-control fluid temperature which are detected in real time; and
- acquiring a second feedback signal, the second feedback signal comprising the edge region temperature and the second temperature-control fluid temperature which are detected in real time;
- wherein the feedback signal comprises the first feedback signal and the second feedback signal.

The controller can perform feedback control on the center region and the edge region of the etching workbench 500 by a dual-loop PID control algorithm or a neural network model. By the self-learning model of the neural network, the control strategy can automatically adjust parameters according to different etched products, without human intervention.

S704: A temperature control instruction is determined according to the feedback signal and the initial temperature control instruction.

This step specifically comprises:
- determining a center temperature control instruction according to the first feedback signal and the initial center temperature control instruction; and
- determining an edge temperature control instruction according to the second feedback signal and the initial edge temperature control instruction;
- wherein the temperature control instruction comprises the center temperature control instruction and the edge temperature control instruction.

Specifically, the changes in temperature of the center region and the edge region of the workbench are monitored in real time by the first feedback signal and the second feedback signal, and the change of the temperature control fluid is also added to the comprehensive control strategy, so that the temperature control fluid is maintained at a temperature capable of absorbing heat efficiently. The initial center temperature control instruction and the initial edge temperature control instruction are the temperature of the etching workbench 500 and the temperature of the temperature control fluid corresponding to the normal operation states of the center region and the edge region of the etching workbench 500. Further, the temperatures of the center region and the edge region may also be configured according to different flows of the etching process, so that the high-precision processing of etched products is realized, and the performance of integrated circuits is further improved.

It is to be noted that, unlike the control strategy using the temperature of the temperature control fluid as main feedback in the prior art, in the embodiment of the present application, the real-time temperature of the etching workbench 500 is a main controlled object, that is, it is more inclined to use the temperature of the etching workbench as the controlled object in the control strategy. In this way, when the temperature of the etching workbench is changed, temperature adjustment can be controlled in time, thereby greatly increasing the response speed of the temperature control system for the etching workbench 500, quickly giving out a corresponding adjustment instruction for the change in temperature of the etching workbench 500, reducing the temperature fluctuation range of the etching workbench 500 and improving the etching quality of etched products.

S705: In response to the temperature control instruction, the circulating temperature control fluid loop stabilizes a target operating temperature of the etching workbench within a preset range.

In this embodiment, the controller 504 and the controller 508 send the center temperature control instruction and the edge temperature control instruction to the throttle valve 1 and the throttle valve 2 respectively, to control the flow or flow rate of the temperature control medium in the center region temperature adjustment loop 502 and the edge region temperature adjustment loop 506, so as to adjust the rate at which the temperature control medium takes away heat in the temperature control fluid through evaporators (the center region evaporator 503 and the edge region evaporator 507), so that the target operating temperature of the etching workbench 500 is stabilized within the preset range.

This embodiment provides a temperature control method for the etching workbench 500. A real-time temperature of the etching workbench 500 and a real-time temperature of a temperature control fluid are acquired firstly; then, a temperature control instruction is determined according to the real-time temperature of the etching workbench 500, the real-time temperature of the temperature control fluid and a limit temperature; and finally, in response to the temperature control instruction, a target operating temperature of the etching workbench 500 is stabilized within a preset range by a circulating temperature control fluid loop. By adding the feedback quantity of the real-time temperature of the etching workbench 500, the response speed of temperature control is increased, and the overshoot of temperature is reduced, so that the temperature distribution of a substrate during etching is regularized. By dividing the temperature control pipe section into regions, the running route of the temperature control fluid on the etching platform is shortened, a large difference in temperature between the temperature control fluid at the input terminal and the temperature control fluid at the output terminal is avoided, the response speed of temperature control is increased, and the fluctuation in temperature is reduced. Accordingly, the technical problem of poor etching quality caused by substrate deformation due to an uneven temperature distribution of an etching workbench in the prior art is solved, and the technical effects of realizing controllable substrate deformation rules, making the etching effect satisfy the expected design and improving the etching quality are achieved.

Figure 8:
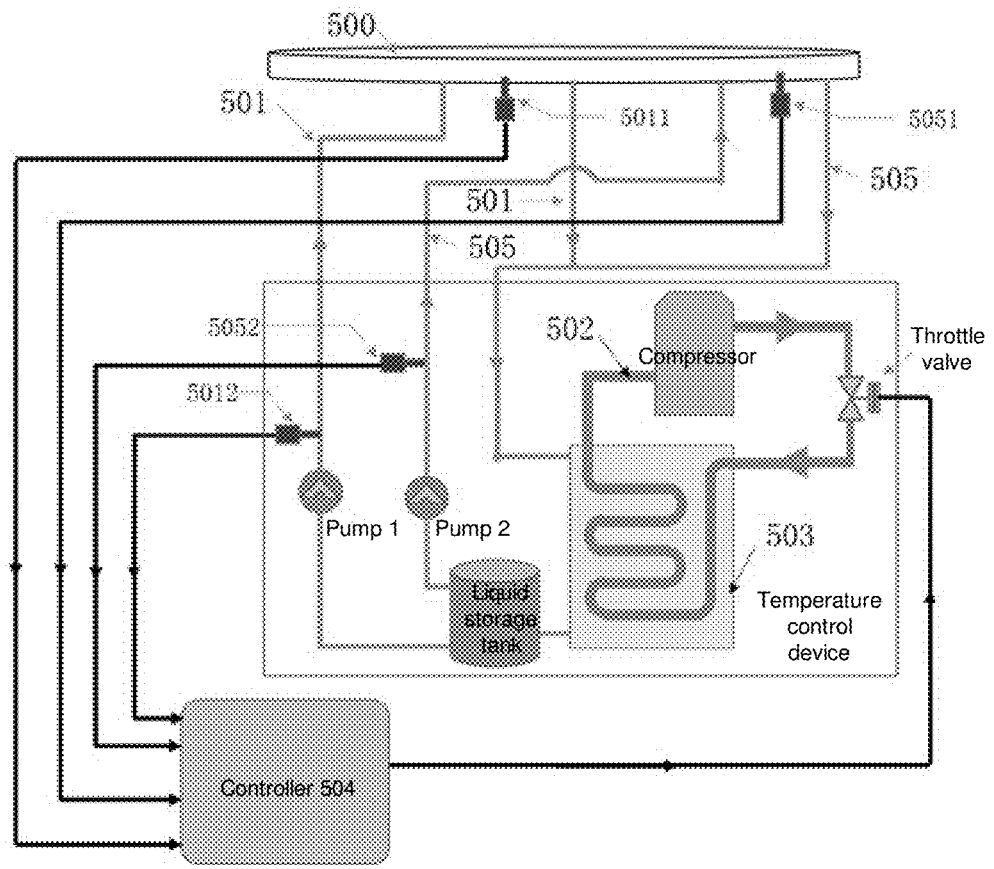
FIG. 8 is a schematic structure diagram of still another temperature control system for an etching workbench according to an embodiment of the present application.

FIG. 8 is a schematic structure diagram of another temperature control system for an etching workbench according to an embodiment of the present application. As shown in FIG. 8, the center loop 501 and the edge loop 505 share one temperature control device. That is, the temperature control fluid in the liquid storage tank is delivered to the first temperature control pipe section 5001 and the second temperature control pipe section 5002 in FIG. 6 by a pump 1 and a pump 2 respectively, and the temperature control fluid finally gathers in the delivery pipe outside the etching workbench 500 and then enter the evaporator 503 for heat dissipation or heating. The structure in FIG. 8 has little change to the temperature control device, and can also achieve similar effects to the two temperature control devices shown in FIG. 5, so that the device improvement cost is reduced.

Figure 9:
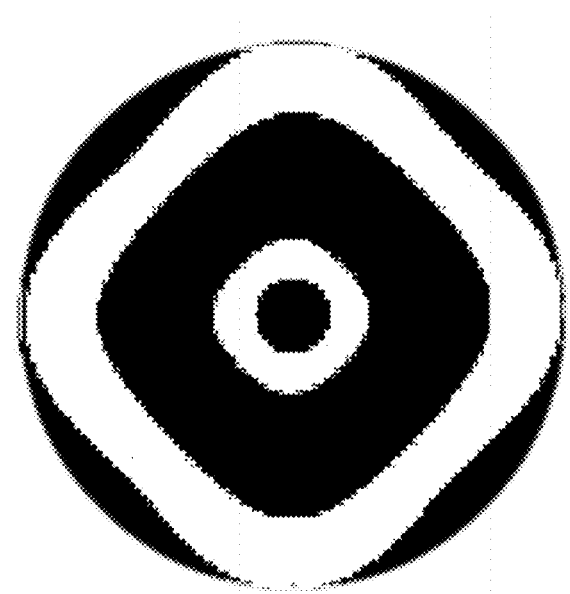
FIG. 9 is a schematic diagram of a temperature distribution of an etching workbench using the temperature control method of the present application according to an embodiment of the present application.

FIG. 9 is a schematic diagram of a temperature distribution of an etching workbench using the temperature control method of the present application according to an embodiment of the present application. As shown in FIG. 9, the temperature distribution of the etching workbench is a regular distribution, so the etching substrate is deformed symmetrically within a controllable range even if it is deformed by heating, and it can be predicted that it is unlike the asymmetrical structure in the prior art (as shown in FIG. 1). Thus, it is convenient for the preparation of the etching process, subsequent quality inspection and classification of etched products. Since the temperature distribution is correlated to the etching depth, it can be known directly from the temperature distribution of the etching workbench that the etching depth distribution of the monocrystalline silicon on the etching workbench also has a similar distribution as show in FIG. 9, so that the improvement in the etching quality is guaranteed.

Figure 10:
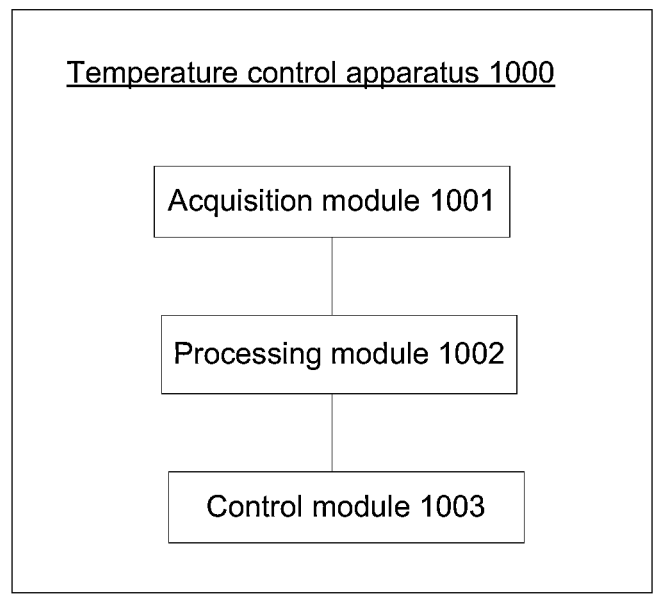
FIG. 10 is a schematic structure diagram of a temperature control apparatus for an etching workbench according to an embodiment of the present application.

FIG. 10 is a schematic structure diagram of a temperature control apparatus for an etching workbench according to an embodiment of the present application. The temperature control apparatus for an etching workbench may be implemented by software, hardware or combination thereof.

As shown in FIG. 10, the temperature control apparatus 1000 for an etching workbench comprises:
an acquisition module 1001, configured to acquire a real-time temperature of the etching workbench and a real-time temperature of a temperature control fluid, the real-time temperature of the etching workbench being a current operating temperature of the etching workbench, the real-time temperature of the temperature control fluid is a current operating temperature of the temperature control fluid in a circulating temperature control fluid loop; and a processing module 1002, configured to determine a temperature control instruction according to the real-time temperature of the etching workbench, the real-time temperature of the temperature control fluid and a limit temperature, and stabilize, by the circulating temperature control fluid loop responding to the temperature control instruction, a target operating temperature of the etching workbench within a preset range.

In one possible design, the processing module 1002 is configured to determine a temperature control instruction according to the real-time temperature of the etching workbench, the real-time temperature of the temperature control fluid and a limit temperature, comprising:
the processing module 1002 is configured to determine an initial temperature control instruction according to the limit temperature;
the acquisition module 1001 is further configured to acquire a feedback signal, the feedback signal comprising the real-time temperature of the etching workbench and the real-time temperature of the temperature control fluid; and
the processing module 1002 is further configured to determine the temperature control instruction according to the feedback signal and the initial temperature control instruction.

In one possible design, the circulating temperature control fluid loop comprises: a center loop and an edge loop, with a first temperature control pipe section of the center loop in a center region of the etching workbench being not connected with a second temperature control pipe section of the edge loop in an edge region of the etching workbench.

In one possible design, the limit temperature comprises a center limit temperature and an edge limit temperature, and the processing module 1002 is further configured to determine an initial temperature control instruction according to the limit temperature, comprising:
the processing module 1002 is further configured to determine an initial center temperature control instruction according to the center limit temperature; and
the processing module 1002 is further configured to determine an initial edge temperature control instruction according to the edge limit temperature;
wherein the initial temperature control instruction comprises the initial center temperature control instruction and the initial edge temperature control instruction.

In one possible design, the real-time temperature of the etching workbench comprises a center region temperature and an edge region temperature, and the real-time temperature of the temperature control fluid comprises a first temperature-control fluid temperature of the center loop and a second temperature-control fluid temperature of the edge loop; and, the acquisition module 1001 is further configured to acquire a feedback signal, comprising:
the acquisition module 1001 is further configured to acquire a first feedback signal, the first feedback signal comprising the center region temperature and the first temperature-control fluid temperature which are detected in real time; and
the acquisition module 1001 is further configured to acquire a second feedback signal, the second feedback signal comprising the edge region temperature and the second temperature-control fluid temperature which are detected in real time;

wherein the feedback signal comprises the first feedback signal and the second feedback signal.

Optionally, the processing module 1002 is further configured to determine the temperature control instruction according to the feedback signal and the initial temperature control instruction, comprising:

the processing module 1002 is further configured to determine a center temperature control instruction according to the first feedback signal and the initial center temperature control instruction; and the processing module 1002 is further configured to determine an edge temperature control instruction according to the second feedback signal and the initial edge temperature control instruction;

wherein the temperature control instruction comprises the center temperature control instruction and the edge temperature control instruction.

In one possible design, the center limit temperature is the same as the edge limit temperature.

It is to be noted that, the temperature control apparatus for an etching workbench provided in the embodiment shown in FIG. 10 can execute the method provided in any one of the above method embodiments, and the specific implementation principles, technical features, explanation of technical terms and technical effects are similar and will not be repeated here.

Figure 11:
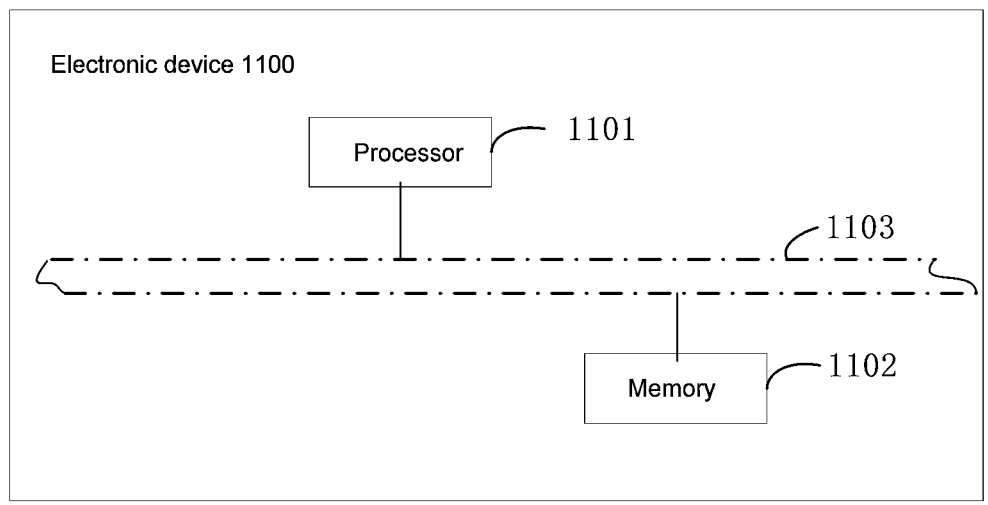
FIG. 11 is a schematic structure diagram of an electronic device according to an embodiment of the present application.

FIG. 11 is a schematic structure diagram of an electronic device according to an embodiment of the present application. As shown in FIG. 11, the electronic device 1100 may comprise: at least one processor 1101 and a memory 1102. FIG. 11 shows an electronic device having one processor.

The memory 1102 is configured to store programs. Specifically, the programs may comprise program codes, and the program codes comprise computer-operated instructions.

The memory 1102 may include high-speed RAM memories, or may comprise non-volatile memories, for example, at least one magnetic disk memory.

The processor 1101 is configured to execute the computer-operated instructions stored in the memory 1102 to implement the methods described in the above method embodiments.

The processor 1101 may be a central processing unit (CPU) or an application specific integrated circuit (ASIC), or be configured as one or more integrated circuits for implementing the embodiments of the present application.

Optionally, the memory 1102 may be independent, or may be integrated with the processor 1101. When the memory 1102 is a device independent of the processor 1101, the electronic device 1100 may further comprise:

a bus 1103, configured to connect the processor 1101 and the memory 1102. The bus may be industry standard architecture (ISA) buses, peripheral component (PCI) buses or extended industry standard architecture (EISA) buses, etc. The bus may be classified into address buses, data buses, control buses, etc. and does not represent one bus or one type of buses.

Optionally, in a specific implementation, if the memory 1102 and the processor 1101 are integrated on one chip, the memory 1102 and the processor 1101 can communicate through an internal interface.

The present application further provides a computer-readable storage medium. The computer-readable storage medium may comprise: U disks, mobile hard disks, read-only memories (ROMs), random access memories (RAMs), magnetic disks, optical disks or various mediums capable of storing program codes. Specifically, the computer-readable storage medium has program codes stored therein that are configured to implement the temperature control methods for an etching workbench according to the above method embodiments.

The present application further provides a computer program, comprising program codes that execute the temperature control methods for an etching workbench according to the above method embodiments when a computer runs the computer program.

The present application further provides a computer program product, comprising computer programs that, when executed by a processor, implement the temperature control methods for an etching workbench according to the above method embodiments.

The foregoing description merely shows the specific implementations of the present application, and the protection scope of the present application is not limited thereto. Any variation or replacement easily obtained by any person of ordinary skill in the art without departing from the technical scope of the present application should be included within the protection scope of the present disclosure. Therefore, the protection scope of the present application shall be subject to the protection scope defined by the claims.

The invention claimed is:

1. A temperature control method for an etching workbench, comprising:
    acquiring, by a controller, a real-time temperature of the etching workbench and a real-time temperature of a temperature control fluid in a workbench temperature control fluid loop, the real-time temperature of the etching workbench being a current operating temperature of the etching workbench, the real-time temperature of the temperature control fluid being a current operating temperature of the temperature control fluid in the workbench temperature control fluid loop;
    determining, by the controller, a temperature control instruction according to the real-time temperature of the etching workbench, the real-time temperature of the temperature control fluid and a limit temperature;
    sending, by the controller, the temperature control instruction to a temperature adjustment loop; and
    stabilizing, by the temperature adjustment loop in response to the temperature control instruction, a target operating temperature of the etching workbench within a preset range by adjusting the real-time temperature of the temperature control fluid in the workbench temperature control fluid loop by an evaporator.

2. The temperature control method for an etching workbench according to claim 1, wherein the determining, by the controller, the temperature control instruction according to the real-time temperature of the etching workbench, the real-time temperature of the temperature control fluid and the limit temperature comprises:
    determining an initial temperature control instruction according to the limit temperature;
    acquiring a feedback signal, the feedback signal comprising the real-time temperature of the etching workbench and the real-time temperature of the temperature control fluid; and
    determining the temperature control instruction according to the feedback signal and the initial temperature control instruction.

3. The temperature control method for an etching workbench according to claim 2, wherein the workbench temperature control fluid loop comprises a center loop and an edge loop, wherein a first temperature control pipe section of the center loop in a center region of the etching workbench is not connected with a second temperature control pipe section of the edge loop in an edge region of the etching workbench.

4. The temperature control method for an etching workbench according to claim 3, wherein the limit temperature comprises a center limit temperature and an edge limit temperature, and the determining an initial temperature control instruction according to the limit temperature comprises:
   determining an initial center temperature control instruction according to the center limit temperature; and
   determining an initial edge temperature control instruction according to the edge limit temperature;
   wherein the initial temperature control instruction comprises the initial center temperature control instruction and the initial edge temperature control instruction.

5. The temperature control method for an etching workbench according to claim 4, wherein the real-time temperature of the etching workbench comprises a center region temperature and an edge region temperature, and the real-time temperature of the temperature control fluid comprises a first temperature-control fluid temperature of the center loop and a second temperature-control fluid temperature of the edge loop; and, the acquiring a feedback signal comprises:
   acquiring a first feedback signal, the first feedback signal comprising the center region temperature and the first temperature-control fluid temperature that are detected in real time; and
   acquiring a second feedback signal, the second feedback signal comprising the edge region temperature and the second temperature-control fluid temperature that are detected in real time;
   wherein the feedback signal comprises the first feedback signal and the second feedback signal.

6. The temperature control method for an etching workbench according to claim 5, wherein the determining the temperature control instruction according to the feedback signal and the initial temperature control instruction comprises:
   determining a center temperature control instruction according to the first feedback signal and the initial center temperature control instruction; and
   determining an edge temperature control instruction according to the second feedback signal and the initial edge temperature control instruction;
   wherein the temperature control instruction comprises the center temperature control instruction and the edge temperature control instruction.

7. An electronic device, comprising a processor and a memory, wherein,
   the memory is configured to store program codes; and
   the processor is configured to call the program codes stored in the memory to execute the temperature control method for an etching workbench according to claim 1.

8. A non-transitory computer-readable storage medium having instructions stored therein that, when run on a computer, cause the computer to execute the temperature control method for an etching workbench according to claim 1.

9. A temperature control system for an etching workbench, comprising: a workbench temperature control fluid loop, a temperature adjustment loop, an evaporator and a controller; wherein both the workbench temperature control fluid loop and the temperature adjustment loop pass through the evaporator, the workbench temperature control fluid loop is not connected with the temperature adjustment loop, and the controller is electrically connected to the workbench temperature control fluid loop and the temperature adjustment loop;
   the workbench temperature control fluid loop is configured to adjust a temperature of the etching workbench; and
   the controller is configured to control the temperature adjustment loop to adjust a real-time temperature of a temperature control fluid in the workbench temperature control fluid loop by the evaporator, so that a target operating temperature of the etching workbench is stabilized within a preset range; and
   the controller is configured to control the temperature adjustment loop in the following manner:
      the controller determines a temperature control instruction according to a limit temperature, the real-time temperature of the temperature control fluid and a real-time temperature of the etching workbench, and
      the controller sends the temperature control instruction to the temperature adjustment loop.

10. The temperature control system for an etching workbench according to claim 9, wherein the workbench temperature control fluid loop comprises: a first sensor, a second sensor, a temperature control pipe section distributed in the etching workbench and a delivery pipe section arranged outside the etching workbench; wherein the first sensor is located on the delivery pipe section, the second sensor is located on the etching workbench, and the first sensor and the second sensor are electrically connected to the controller;
   the temperature control pipe section is configured to adjust the temperature of the etching workbench;
   the first sensor is configured to detect the real-time temperature of the temperature control fluid in the delivery pipe section in real time; and
   the second sensor is configured to detect the real-time temperature of the etching workbench in real time.

11. The temperature control system for an etching workbench according to claim 10, wherein the temperature adjustment loop comprises a throttle valve, a compressor and an evaporator pipe section; wherein an input terminal of the compressor is connected to an output terminal of the evaporator pipe section, an output terminal of the compressor is connected to an input terminal of the throttle valve, an output terminal of the throttle valve is connected to an input terminal of the evaporator pipe section, the throttle valve is electrically connected to the controller;
   the compressor is configured to drive a temperature control medium in the temperature adjustment loop to flow;
   the throttle valve is configured to receive the temperature control instruction from the controller to control a flow of the temperature control medium; and
   the temperature control medium flowing through the evaporator pipe section transfers heat with the temperature control fluid in the workbench temperature control fluid loop by the evaporator, so that the target operating temperature of the etching workbench is stabilized within the preset range.

12. The temperature control system for an etching workbench according to claim 11, wherein the temperature control pipe section comprises a first temperature control pipe section and a second temperature control pipe section, the first temperature control pipe section is located in a center region of the etching workbench, the second temperature control pipe section is located in an edge region of the etching workbench, and the first temperature control pipe section is not connected with the second temperature control pipe section in the etching workbench;

the second sensor comprises a center region sensor and an edge region sensor, the center region sensor is configured to detect a real-time temperature of the center region of the etching workbench in real time and the edge region sensor is configured to detect a real-time temperature of the edge region of the etching workbench in real time; and correspondingly, the controller determines the temperature control instruction according to the limit temperature, the real-time temperature of the center region, the real-time temperature of the edge region and the real-time temperature of the temperature control fluid.

13. The temperature control system for an etching workbench according to claim 12, wherein there is a temperature isolation zone between the first temperature control pipe section and the second temperature control pipe section, and the temperature isolation zone is configured to isolate heat transfer between the first temperature control pipe section and the second temperature control pipe section.

14. The temperature control system for an etching workbench according to claim 12, wherein the workbench temperature control fluid loop comprises a center loop and an edge loop, the center loop and the edge loop are independent loops, the first temperature control pipe section is located in the center loop, and the second temperature control pipe section is located in the edge loop.

15. The temperature control system for an etching workbench according to claim 14, wherein the temperature adjustment loop comprises a center region temperature adjustment loop and an edge region temperature adjustment loop, and the evaporator comprises a center region evaporator and an edge region evaporator.

16. The temperature control system for an etching workbench according to claim 10, wherein the workbench temperature control fluid loop further comprises a temperature control fluid pump, and the first sensor is configured to detect the real-time temperature of the temperature control fluid at an output terminal of the temperature control fluid pump in real time.

* * * * *